(12) United States Patent
Tsai

(10) Patent No.: US 12,009,424 B2
(45) Date of Patent: Jun. 11, 2024

(54) SEMICONDUCTOR DEVICE, AND METHOD FOR MANUFACTURING THE SAME

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 388 days.

(21) Appl. No.: 17/541,845

(22) Filed: Dec. 3, 2021

(65) Prior Publication Data

US 2023/0178613 A1 Jun. 8, 2023

(51) Int. Cl.
*H01L 29/78* (2006.01)
*H01L 29/40* (2006.01)
*H01L 29/417* (2006.01)
*H01L 29/66* (2006.01)

(52) U.S. Cl.
CPC ........ *H01L 29/7834* (2013.01); *H01L 29/401* (2013.01); *H01L 29/41775* (2013.01); *H01L 29/6659* (2013.01); *H01L 29/6656* (2013.01)

(58) Field of Classification Search
CPC ............. H01L 29/7834; H01L 29/6656; H01L 29/41775; H01L 29/6659
See application file for complete search history.

(56) References Cited

U.S. PATENT DOCUMENTS

| | | | |
|---|---|---|---|
| 5,920,783 A | 7/1999 | Tseng et al. | |
| 2005/0164462 A1* | 7/2005 | Kim | H01L 29/7834 257/E29.267 |
| 2008/0124861 A1* | 5/2008 | Lin | H01L 21/823864 257/E21.632 |
| 2008/0299724 A1 | 12/2008 | Grudowski et al. | |
| 2012/0161243 A1* | 6/2012 | Kronholz | H01L 21/823864 257/E21.619 |
| 2012/0326162 A1* | 12/2012 | Lin | H01L 21/28247 257/77 |
| 2014/0291759 A1* | 10/2014 | Zhao | H01L 29/7833 438/289 |
| 2020/0066846 A1* | 2/2020 | Kondo | H01L 29/78 |
| 2023/0178608 A1* | 6/2023 | Tsai | H01L 29/7834 257/344 |

FOREIGN PATENT DOCUMENTS

TW 202119478 A 5/2021

OTHER PUBLICATIONS

Office Action mailed on Sep. 14, 2023 related to U.S. Appl. No. 17/543,914.
Office Action mailed on Mar. 6, 2023 related to Taiwanese Application No. 111107762.

* cited by examiner

*Primary Examiner* — Joseph C. Nicely
(74) *Attorney, Agent, or Firm* — Xuan Zhang

(57) ABSTRACT

A semiconductor device and a method of manufacturing a semiconductor device are provided. The semiconductor device includes a substrate having a first surface and a second surface protruding from the first surface of the substrate; a gate oxide layer disposed on the second surface of the substrate; and a first spacer disposed on the first surface of the substrate, and contacting the substrate and the gate oxide layer.

16 Claims, 14 Drawing Sheets

SEMICONDUCTOR DEVICE, AND METHOD FOR MANUFACTURING THE SAME

TECHNICAL FIELD

The present disclosure relates to a semiconductor device and a method for manufacturing a semiconductor device, and more particularly, to a semiconductor device with a low gate height.

DISCUSSION OF THE BACKGROUND

Metal-Oxide-Semiconductor Field-Effect Transistors (MOSFETs) are commonly used in memory devices, including dynamic random access memory (DRAM) devices. A MOSFET is typically formed by providing a gate structure on a semiconductor substrate to define a channel region, and by forming source and drain regions on opposing sides of the channel region.

As DRAM devices are scaled down, parasitic capacitance (e.g., outer-fringe capacitance, gate-to-plug capacitance, plug-to-plug capacitance) and parasitic resistance become significant, thus diminishing device performance.

In addition, short-channel effect (such as a punch-through phenomenon) may occur when the channel length decreases. Due to the short-channel effect, a DRAM device may suffer from problems related to the inability of the gate to substantially control the on and off states of the channel region, and variations in electronic characteristics may occur.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate having a surface. The surface has a first portion and a second portion protruding from the first portion. The semiconductor device also includes a dielectric layer disposed on the second portion and a gate conductive layer disposed on the dielectric layer.

Another aspect of the present disclosure provides a semiconductor device. The semiconductor device includes a substrate having a first surface and a second surface protruding from the first surface of the substrate. The semiconductor device also includes a gate oxide layer disposed on the second surface of the substrate and a first spacer disposed on the first surface of the substrate. The first spacer contacts the substrate and the gate oxide layer.

Another aspect of the present disclosure provides a method of manufacturing a semiconductor device. The method includes disposing a dielectric layer on a substrate, disposing a gate conductive layer on the dielectric layer, and forming a surface of the substrate substantially coplanar with a lateral surface of the dielectric layer and a lateral surface of the gate conductive layer.

By forming a gate structure (including a gate conductive layer and a dielectric layer) on an elevated portion of a substrate, the gate conductive layer is elevated, the height of the gate conductive layer may be reduced while the total height of the gate structure remained substantially unchanged. Compared with a conventional structure (i.e., the gate conductive layer is not elevated and the height of the gate conductive layer is greater), the reduced height of the gate conductive layer can prevent or decrease the unwanted parasitic capacitance. In addition, since the substrate has an elevated portion and the gate conductive layer is elevated, the effective channel length is increased and short-channel effect can be mitigated.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
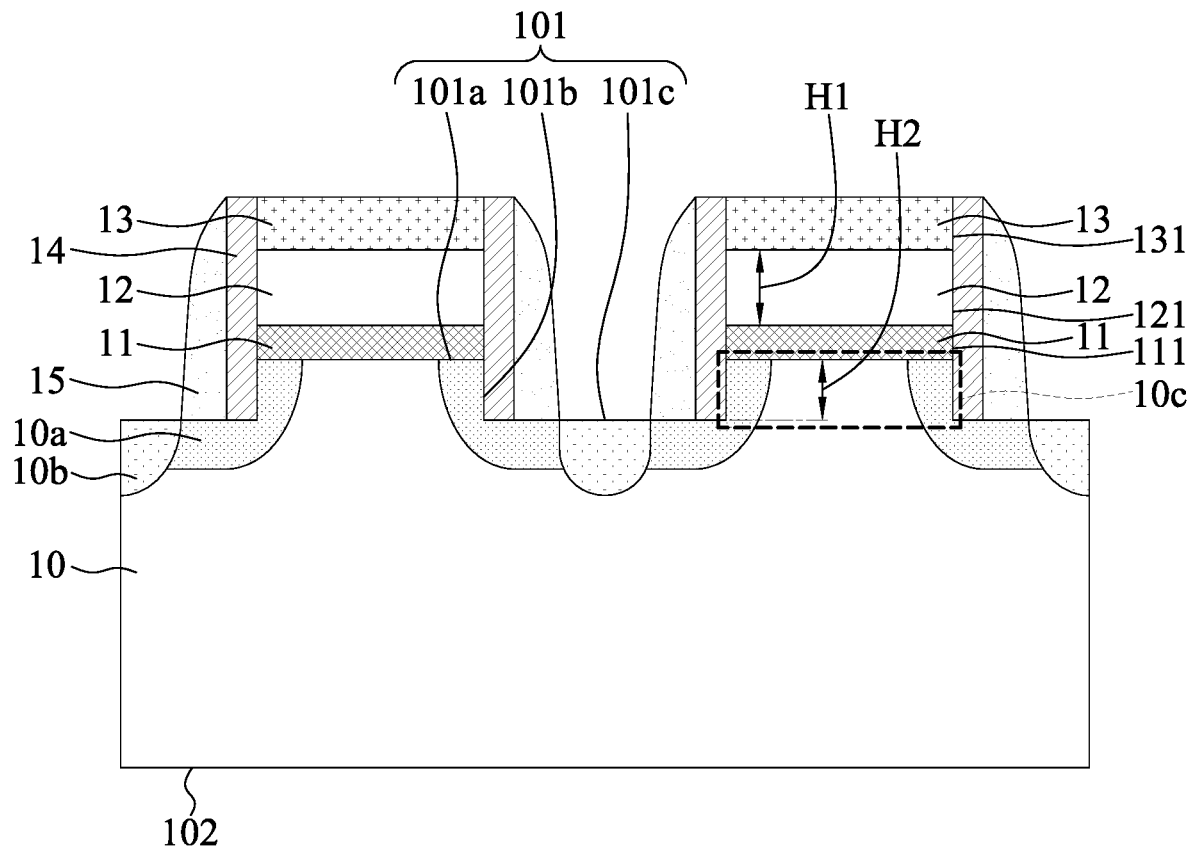
FIG. 1A is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a cross-sectional view of a semiconductor device 1 in accordance with some embodiments of the present disclosure. In some embodiments, the semiconductor device 1 may include a circuit, such as a memory cell. In some embodiments, the memory cell may include a dynamic random access memory cell (DRAM cell).

In addition, the semiconductor device 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

While two MOSFETs are illustrated in the figures, it will be appreciated that the semiconductor device 1 may be or include any suitable number of passive and active microelectronic devices described.

As shown in FIG. 1, in some embodiments, the semiconductor device 1 may include a substrate 10, a dielectric layer 11, a gate conductive layer 12, a capping layer 13, and spacers 14 and 15.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a semiconductor-on-insulator substrate, such as a silicon-on-insulator (SOI) substrate, a silicon germanium-on-insulator (SGOI) substrate, or a germanium-on-insulator (GOI) substrate.

Depending on the IC fabrication stage, the substrate 10 may include various material layers (e.g., dielectric layers, semiconductor layers, and/or conductive layers) configured to form IC features (e.g., doped regions, isolation features, gate features, source/drain features, interconnect features, other features, or combinations thereof).

The substrate 10 of FIG. 1A has been simplified for the sake of clarity. It should be noted that additional features can be added in the substrate 10, and some of the features described below can be replaced, modified, or eliminated in other embodiments.

In the depicted embodiment, the substrate 10 may include a surface 101 and a surface 102 opposite to the surface 101. In some embodiments, the surface 101 may be an active surface and the surface 102 may be a backside surface of the substrate 10.

In some embodiments, the surface 101 may include a portion 101a, a portion 101b, and a portion 101c. In some embodiments, the portion 101a and the portion 101c may not be coplanar. In some embodiments, the portion 101a may protrude from the portion 101c. In some embodiments, the portion 101c may be recessed from the portion 101a. In some embodiments, the portion 101a and the portion 101c may be substantially parallel. In some embodiments, the portion 101b may extend between the portion 101a and the portion 101c. In some embodiments, the portion 101b may be connected between the portion 101a and the portion 101c. In some embodiments, the portion 101b may be angled with respect to the portion 101a and/or the portion 101c. In some embodiments, the portion 101b may be substantially perpendicular to the portion 101a and/or the portion 101c.

In some embodiments, the surface 101 may define a stepped structure. For example, the portion 101a, the portion 101b, and the portion 101c may define a stepped structure of the substrate 10.

In some embodiments, the portion 101a, the portion 101b, and the portion 101c may define an elevated or raised portion 10c of the substrate 10. In some embodiments, the elevated portion 10c may be configured to elevate or raise the gate structure (including the dielectric layer 11, the gate conductive layer 12, and the capping layer 13). For example, the gate structure (including the dielectric layer 11, the gate conductive layer 12, and the capping layer 13) may be spaced apart from the portion 101c of the surface 101 by the elevated portion 10c.

In some embodiments, a channel region (not shown in the figures) may be formed in the substrate 10 beneath the dielectric layer 11, such as formed in the elevated portion 10c. In some embodiments, the channel region in the substrate 10 may be doped. In some embodiments, the gate conductive layer 12 may be configured to influence or control charge carriers in the channel region.

In some embodiments, the substrate 10 may have a doped region 10a and a doped region 10b disposed over or in the substrate 10. In some embodiments, the doped region 10a and the doped region 10b may be disposed over or proximal to the surface 101 of the substrate 10.

In some embodiments, the doped region 10a may include a lightly doped region, such as a lightly doped drain (LDD) region. The doped region 10a may be adjacent to the channel region beneath the dielectric layer 11 and extend laterally away from the channel region. In some embodiments, for an NMOS device, the doped region 10a may be doped with N-type dopants (such as phosphorus (P), arsenic (As), or antimony (Sb)) and the channel region may be doped with P-type dopants. In some other embodiments, for a PMOS device, the doped region 10a may be doped with P-type dopants (such as boron (B) or indium (In)) and the channel region may be doped with N-type dopants.

In some embodiments, the doped region 10a may have a doping concentration lower than a doping concentration of the doped region 10b. In some embodiments, the doped region 10a may border the channel region beneath the dielectric layer 11. In some embodiments, the doped region 10a may reduce the electric field between the doped region 10b and the channel region and help minimize hot-carrier effect.

In some embodiments, the doped region 10a may be at least partially exposed from the elevated portion 10c of the substrate 10. For example, the doped region 10a may be at least partially exposed from the portion 101a, the portion 101b, and/or the portion 101c of the surface 101 of the substrate 10.

In some embodiments, the doped region 10b may include a heavily doped region. In some embodiments, the doped region 10b may include a source region and/or a drain region. In some embodiments, the doped region 10b may be disposed in the doped region 10a. In some embodiments, the doped region 10b may be surrounded by the doped region 10a. In some embodiments, the doped region 10b may be adjacent to the doped region 10a. In some embodiments, the doped region 10b may be formed by implanting into the substrate 10 N-type (for an NMOS device) or P-type dopants (for a PMOS device) at a doping level significantly higher than the ion implant dose used to form the doped region 10a. The doped region 10a and the doped region 10b may have the same doping type. In the areas where the doped region 10b overlaps the doped region 10a, the heavier doping level of the doped region 10b may overcome the lighter doping level of the doped region 10a. Therefore, a source region and/or a drain region may be formed in the overlapped areas.

In some embodiments, the doped region 10b may not be exposed from the elevated portion 10c of the substrate 10, as shown in FIG. 1A. However, in some other embodiments, the doped region 10b may at least partially exposed from the elevated portion 10c of the substrate 10. For example, the doped region 10b may be at least partially exposed from the portion 101a, the portion 101b, and/or the portion 101c of the surface 101 of the substrate 10.

In some embodiments, the dielectric layer 11 may be disposed on the portion 101a of the surface 101 of the substrate 10. For example, the dielectric layer 11 may be in contact with the portion 101a of the surface 101 of the substrate 10. For example, the dielectric layer 11 may overlap with the portion 101a of the surface 101 of the substrate 10. In some embodiments, the dielectric layer 11 may be spaced apart from the portion 101c of the surface 101 of the substrate 10. For example, the dielectric layer 11 may not be in contact with the portion 101c of the surface 101 of the substrate 10.

In some embodiments, the dielectric layer 11 may have a surface (or a lateral surface) 111 substantially coplanar with the portion 101b of the surface 101 of the substrate 10.

In some embodiments, the dielectric layer 11 may include a gate oxide layer. In some embodiments, the dielectric layer 11 may include, for example, hafnium silicate ($HfSiO_x$), hafnium oxide ($HfO_2$), zirconium silicate ($ZrSiO_x$), zirconium oxide ($ZrO_2$), silicon nitride ($Si_3N_4$), silicon oxynitride (SiON), or silicon oxide ($SiO_2$). In some embodiments, the dielectric layer 11 may have a single-layer structure. In some embodiments, the dielectric layer 11 may have a plurality of layers stacking on one another.

In some embodiments, the gate conductive layer 12 may be disposed on the dielectric layer 11. For example, the gate conductive layer 12 may be in contact with the dielectric layer 11. In some embodiments, the gate conductive layer 12, the dielectric layer 11, and the portion 101a of the surface 101 of the substrate 10 may overlap. In some embodiments, the dielectric layer 11 may be disposed between the gate conductive layer 12 and the portion 101a of the surface 101 of the substrate 10. In some embodiments, the gate conductive layer 12 may be spaced apart from the portion 101c of the surface 101 of the substrate 10. For example, the gate conductive layer 12 may not be in contact with the portion 101c of the surface 101 of the substrate 10.

In some embodiments, the gate conductive layer 12 may have a surface (or a lateral surface) 121 substantially coplanar with the portion 101b of the surface 101 of the substrate 10 and/or the surface 111 of the dielectric layer 11.

In some embodiments, the gate conductive layer 12 may include a gate electrode, a gate metal, or a gate conductor. In some embodiments, the gate conductive layer 12 may include, for example, polysilicon (poly-Si), metals (such as aluminum (Al), magnesium (Mg), tungsten (W), lanthanum (La), etc.), or metal alloys. In some embodiments, the gate conductive layer 12 may include, for example, titanium-based materials (such as titanium nitride (TiN) or titanium aluminum nitride (TiAlN)), tantalum-based materials (such as tantalum nitride (TaN), tantalum aluminum nitride (TaAlN), or tantalum carbide ($Ta_2C$), or silicide (such as PtSi, $TiSi_2$, CoSi, NiSi, $MoSi_2$, TaSi, $WSi_2$, etc.). In some embodiments, the gate conductive layer 12 may include a single-layer structure as shown in FIG. 1A or a multilayer structure (which will be described below with respect to FIG. 1B).

In some embodiments, the capping layer 13 may be disposed on the gate conductive layer 12. For example, the capping layer 13 may be in contact with the gate conductive layer 12. In some embodiments, the capping layer 13, the gate conductive layer 12, the dielectric layer 11, and the portion 101a of the surface 101 of the substrate 10 may overlap. In some embodiments, the gate conductive layer 12 may be disposed between dielectric layer 11 and the capping layer 13. In some embodiments, the capping layer 13 may be spaced apart from the portion 101c of the surface 101 of the substrate 10. For example, the capping layer 13 may not be in contact with the portion 101c of the surface 101 of the substrate 10.

In some embodiments, the capping layer 13 may have a surface (or a lateral surface) 131 substantially coplanar with the portion 101b of the surface 101 of the substrate 10, the surface 111 of the dielectric layer 11, and/or the surface 121 of the gate conductive layer 12.

In some embodiments, the capping layer 13 may include a gate top insulator. In some embodiments, the capping layer 13 may include, for example, silicon nitride ($Si_3N_4$), silicon oxynitride (SiON), or silicon oxide ($SiO_2$). In some embodiments, the capping layer 13 may include, for example, titanium-based materials (such as titanium nitride (TiN) or titanium aluminum nitride (TiAlN)), tantalum-based materials (such as tantalum nitride (TaN), tantalum aluminum nitride (TaAlN), or tantalum carbide ($Ta_2C$), or silicide (such as PtSi, $TiSi_2$, CoSi, NiSi, $MoSi_2$, TaSi, $WSi_2$, etc.)).

In some embodiments, the spacer 14 may be disposed on the portion 101c of the surface 101 of the substrate 10. In some embodiments, the spacer 14 may be in contact with the portion 101c of the surface 101 of the substrate 10, the portion 101b of the surface 101 of the substrate 10, the surface 111 of the dielectric layer 11, the surface 121 of the gate conductive layer 12, and/or the surface 131 of the capping layer 13. In some embodiments, the spacer 14 may not be in contact with the portion 101a of the surface 101 of the substrate 10.

In some embodiments, the spacer 14 may cover, seal, or encapsulate the sides of the gate structure (including the dielectric layer 11, the gate conductive layer 12, and the capping layer 13) on the substrate 10. In some embodiments, the spacer 14 may extend between the capping layer 13 and the portion 101c of the surface 101 of the substrate 10.

In some embodiments, the spacer 15 may be disposed on the portion 101c of the surface 101 of the substrate 10. In some embodiments, the spacer 15 may be in contact with the portion 101c of the surface 101 of the substrate 10. In some embodiments, the spacer 15 may be in contact with the spacer 14.

In some embodiments, the spacer 14 may be disposed between the spacer 15 and the portion 101b of the surface 101 of the substrate 10. In some embodiments, the spacer 14 may be disposed between the spacer 15 and the portion 101a of the surface 101 of the substrate 10.

In some embodiments, the spacer 14 may be disposed between the spacer 15 and the surface 111 of the dielectric layer 11. In some embodiments, the spacer 14 may be disposed between the spacer 15 and the surface 121 of the gate conductive layer 12. In some embodiments, the spacer 14 may be disposed between the spacer 15 and the surface 131 of the capping layer 13.

In some embodiments, the spacer 14 and the spacer 15 may include, for example, nitride, oxide, or oxynitride. Exemplary spacer materials may include, but are not limited to, silicon nitride ($Si_3N_4$), silicon oxynitride (SiON), silicon oxide ($SiO_2$), tetraethylorthosilicate (TEOS), carbon doped nitride, or carbon doped nitride without oxide components.

In some embodiments, the gate conductive layer 12 may have a height "H1." The height H1 may be measured in a direction substantially perpendicular to the portion 101a of the surface 101 of the substrate 10. The height H1 may be defined between an upper surface (contacting the capping layer 13) of the gate conductive layer 12 and a bottom surface (contacting the dielectric layer 11) of the gate conductive layer 12. The height H1 may be defined by the surface 121 of the gate conductive layer 12.

In some embodiments, the elevated portion 10c of the substrate 10 may have a height "H2." The height H2 may be measured in a direction substantially perpendicular to the portion 101a of the surface 101 of the substrate 10. The height H2 may be defined between the portion 101a of the surface 101 of the substrate 10 and the portion 101c of the surface 101 of the substrate 10. The height H2 may be defined by the portion 101b of the surface 101 of the substrate 10.

In some embodiments, the height H1 of the gate conductive layer 12 may be different from the height H2 of the elevated portion 10c of the substrate 10. In some embodiments, the height H1 of the gate conductive layer 12 may be greater than the height H2 of the elevated portion 10c of the substrate 10. In some embodiments, the height H1 of the gate conductive layer 12 may be less than the height H2 of the elevated portion 10c of the substrate 10. In some embodiments, the ratio of the height H1 to the height H2 may be between about 3:2 and about 9:1.

As DRAM devices (such as the semiconductor device 1) are scaled down, parasitic capacitance (e.g., outer-fringe capacitance, gate-to-plug capacitance, plug-to-plug capacitance) and parasitic resistance become significant, thus diminishing device performance. In addition, short-channel effect (such as a punch-through phenomenon) may occur when the channel length decreases. Due to the short-channel effect, a DRAM device (such as the semiconductor device 1) may suffer from problems related to the inability of the gate (such as the gate conductive layer 12) to substantially control the on and off states of the channel region, and variations in electronic characteristics may occur.

According to some embodiments of the present disclosure, the gate structure (including the dielectric layer 11, the gate conductive layer 12, and the capping layer 13) is disposed on the elevated portion 10c of the substrate 10. Therefore, the gate conductive layer 12 is elevated, and the height H1 of the gate conductive layer 12 may be reduced while the total height of the gate structure (such as the total height measured from the portion 101c of the surface 101 to the topmost surface of the gate structure) remains substantially unchanged.

Compared with a conventional structure (i.e., the gate conductive layer is not elevated and the height of the gate conductive layer is greater), the reduced height of the gate conductive layer 12 can prevent or decrease the unwanted parasitic capacitance.

In addition, since the substrate 10 has the elevated portion 10c and the gate conductive layer 12 is elevated, the effective channel length in the channel region beneath the dielectric layer 11 is increased and short-channel effect can be mitigated.

Figure 1B:
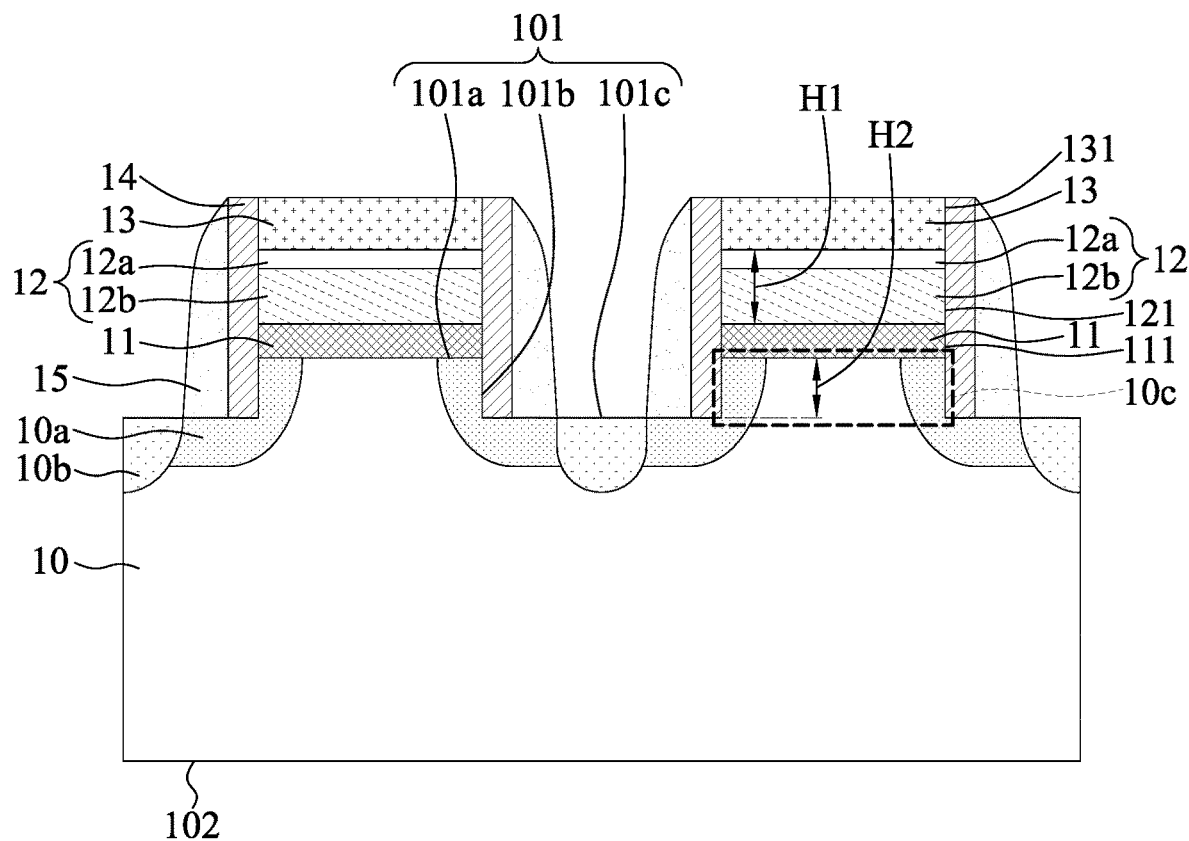
FIG. 1B is a schematic cross-sectional view of a semiconductor device in accordance with some embodiments of the present disclosure.

FIG. 1B is a schematic cross-sectional view of a semiconductor device 1' in accordance with some embodiments of the present disclosure. The semiconductor device 1' of FIG. 1B is similar to the semiconductor device 1 of FIG. 1A, except for the differences described below.

In FIG. 1B, the gate conductive layer 12 of the semiconductor device 1' may include a multilayer structure. For example, the gate conductive layer 12 of the semiconductor device 1' may include a sublayer 12a and a sublayer 12b.

In some embodiments, the sublayer 12a may be disposed on the sublayer 12b. For example, the sublayer 12a may be in contact with the sublayer 12b. In some embodiments, the sublayer 12a may be disposed between the sublayer 12b and the capping layer 13. In some embodiments, the sublayer 12a may include, for example, polysilicon (poly-Si).

In some embodiments, the sublayer 12b may be disposed on the dielectric layer 11. In some embodiments, the sublayer 12b may be in contact with the dielectric layer 11. In some embodiments, the sublayer 12b may be disposed between the dielectric layer 11 and the sublayer 12a. In some embodiments, the sublayer 12b may include, for example, metals (such as aluminum (Al), magnesium (Mg), tungsten (W), lanthanum (La), etc.), or metal alloys.

In some embodiments, height H1 of the gate conductive layer 12 (including the sublayers 12a and 12b) may be different from the height H2 of the elevated portion 10c of the substrate 10. In some embodiments, the height H1 of the gate conductive layer 12 (including the sublayers 12a and 12b) may be greater than the height H2 of the elevated portion 10c of the substrate 10. In some embodiments, the height H1 of the gate conductive layer 12 (including the sublayers 12a and 12b) may be less than the height H2 of the elevated portion 10c of the substrate 10. In some embodiments, the ratio of the height H1 to the height H2 may be between about 3:2 and about 9:1.

Figure 1C:
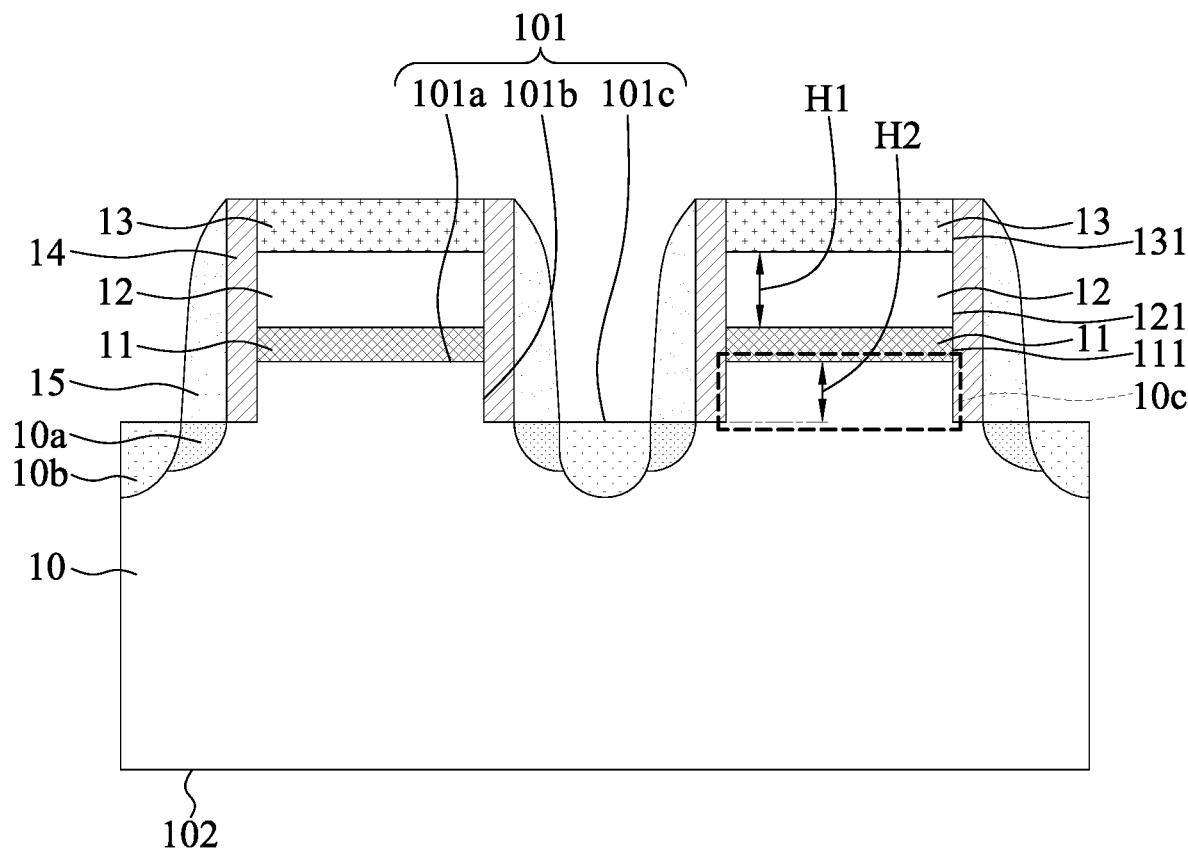
FIG. 1C is a schematic cross-sectional view of a semiconductor device in accordance with some embodiments of the present disclosure.

FIG. 1C is a schematic cross-sectional view of a semiconductor device F' in accordance with some embodiments of the present disclosure. The semiconductor device 1" of FIG. 1C is similar to the semiconductor device 1 of FIG. 1A, except for the differences described below.

In FIG. 1C, the doped region 10a of the semiconductor device 1" is spaced apart from the elevated portion 10c of the substrate 10. For example, the doped region 10a of the semiconductor device 1" is not exposed from the portion 101a and/or the portion 101b of the surface 101 of the substrate 10.

FIGS. 2A, 2B, 2C, 2D, 2E, 2F, 2G, 2H, 2I and 2J illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1A, the semiconductor device 1' in FIG. 1B, and the semiconductor device 1" in FIG. 1C may be manufactured by the operations described below with respect to FIGS. 2A, 2B, 2C, 2D, 2E, 2F, 2G, 2H, 2I and 2J.

Figure 2A:
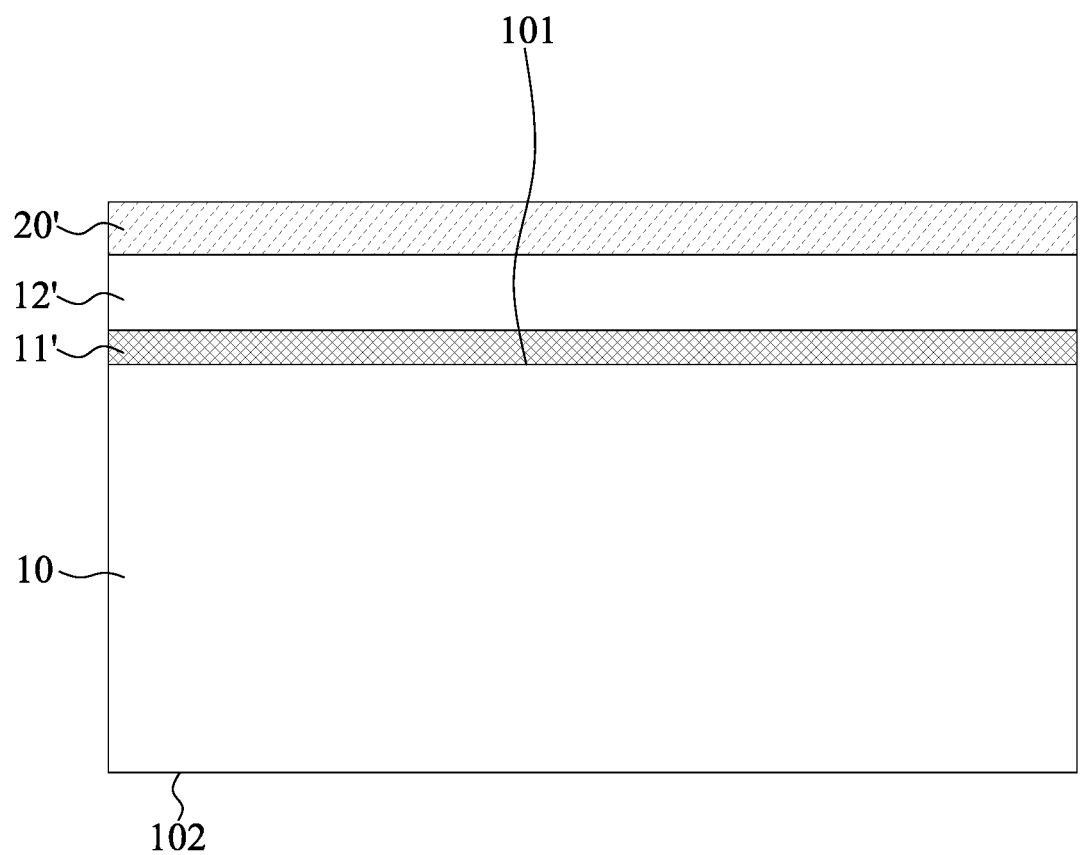
FIG. 2A illustrates one or more stages of a method of manufacturing a semiconductor device in accordance with some embodiments of the present disclosure.

Referring to FIG. 2A, the substrate 10 is provided. In some embodiments, shallow trench isolation (STI) regions (not shown in the figures) may be formed within the substrate 10 using, for example, lithographic, etch, deposition, and chemical mechanical planarization (CMP) processes, to electrically isolate the subsequently formed MOSFET.

In some embodiments, a dielectric layer 11' may be disposed on the surface 101 of substrate 10. In some embodiments, the dielectric layer 11' may be formed by a thermal oxidation operation. In some other embodiments, the dielectric layer 11' may be formed through, for example, chemical vapor deposition (CVD), low pressure chemical vapor deposition (LPCVD), plasma enhanced chemical vapor deposition (PECVD), other feasible operations, or a combination thereof.

In some embodiments, a gate conductive layer 12' may be disposed on the dielectric layer 11'. In some embodiments, the gate conductive layer 12' may be a polysilicon (poly-Si) layer formed by deposited undoped polycrystalline silicon and is subsequently impurity doped by ion implantation. In some other embodiments, the gate conductive layer 12' may include a multilayer structure. For example, the gate conductive layer 12' may be formed by atomic layer deposition (ALD), physical vapor deposition (PVD), CVD, a silicide process, other feasible operations, or a combination thereof.

In some embodiments, a hard mask 20' may be deposited on the gate conductive layer 12'. In some embodiments, the hard mask 20' may include, for example, silicon nitride ($Si_3N_4$), silicon oxynitride (SiON), silicon oxide ($SiO_2$), or titanium nitride (TiN). In some embodiments, the hard mask 20' may be formed through, for example, CVD, LPCVD, PECVD, other feasible operations, or a combination thereof.

Figure 2B:
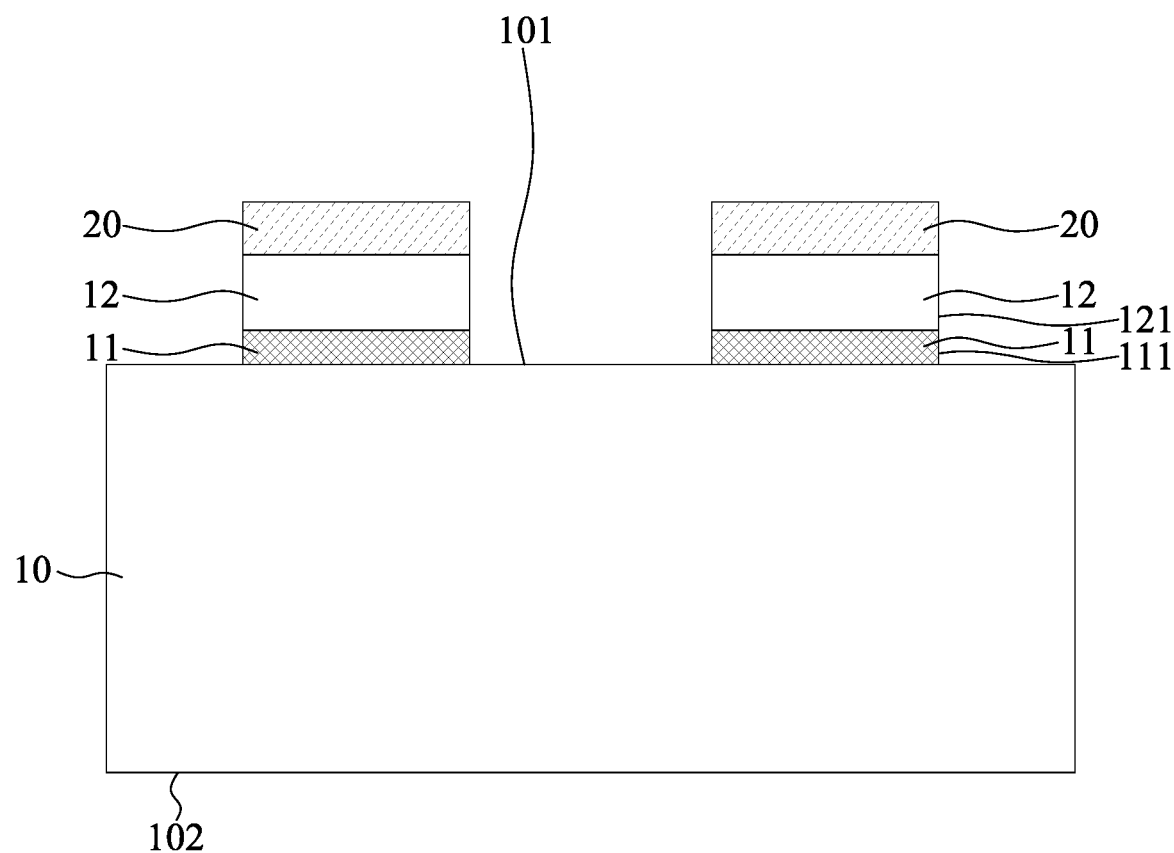
FIG. 2B illustrates one or more stages of a method of manufacturing a semiconductor device in accordance with some embodiments of the present disclosure.

Referring to FIG. 2B, the hard mask 20' may be patterned using photolithography and etching processes, to form a hard mask pattern 20. The dielectric layer 11' and the gate conductive layer 12' may be sequentially patterned by etching using the hard mask pattern 20 as an etch mask. As a result, the dielectric layer 11 and the gate conductive layer 12 may be formed.

In some embodiments, the dielectric layer 11' and the gate conductive layer 12' may be anisotropically etched. In some embodiments, the dielectric layer 11' and the gate conductive layer 12' may be etched in the same operation. In some embodiments, the dielectric layer 11' and the gate conductive layer 12' may be etched in different operations. For example, the dielectric layer 11' and the gate conductive layer 12' may be etched by using, for example, reactive ion etching (RIE) with different chemistry.

In some embodiments, after the dielectric layer 11 and the gate conductive layer 12 are formed, the surface (or a lateral surface) 111 of the dielectric layer 11 may be substantially coplanar with the surface (or a lateral surface) 121 of the gate conductive layer 12.

Figure 2C:
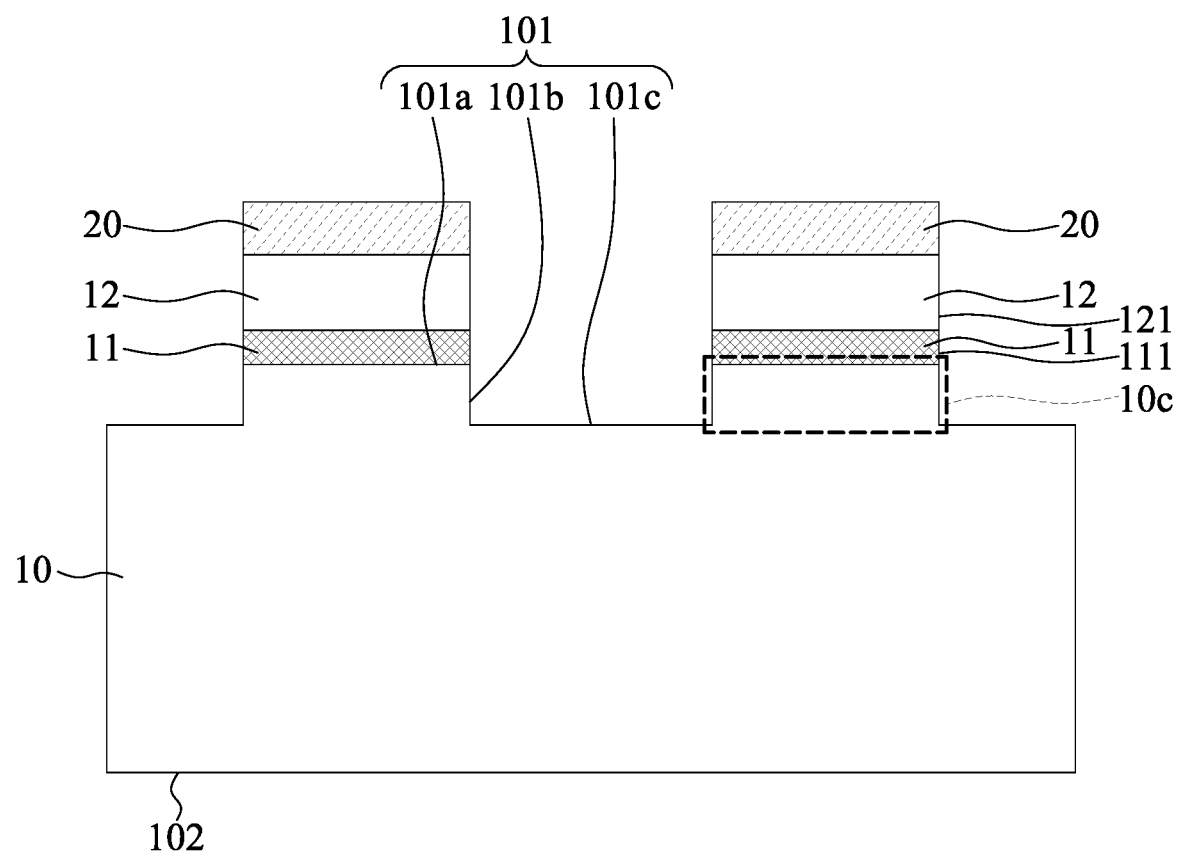
FIG. 2C illustrates one or more stages of a method of manufacturing a semiconductor device in accordance with some embodiments of the present disclosure.

Referring to FIG. 2C, the substrate 10 may be patterned by etching using the hard mask pattern 20 as an etch mask. As a result, the elevated portion 10c may be formed.

In some embodiments, the substrate 10 may be anisotropically etched. In some embodiments, the substrate 10 may be etched in an operation different from that of the dielectric layer 11' and the gate conductive layer 12' in FIG. 2A. For example, the substrate 10 may be etched by using, for example, RIE with chemistry different from that of the dielectric layer 11' and the gate conductive layer 12'.

In some embodiments, after the elevated portion 10c is formed, the portion 101a of the surface 101 of the substrate 10 may protrude from the portion 101c of the surface 101 of the substrate 10.

In some embodiments, the portion 101b of the surface 101 of the substrate 10 may be substantially coplanar with the surface 111 of the dielectric layer 11 and/or the surface 121 of the gate conductive layer 12.

Figure 2D:
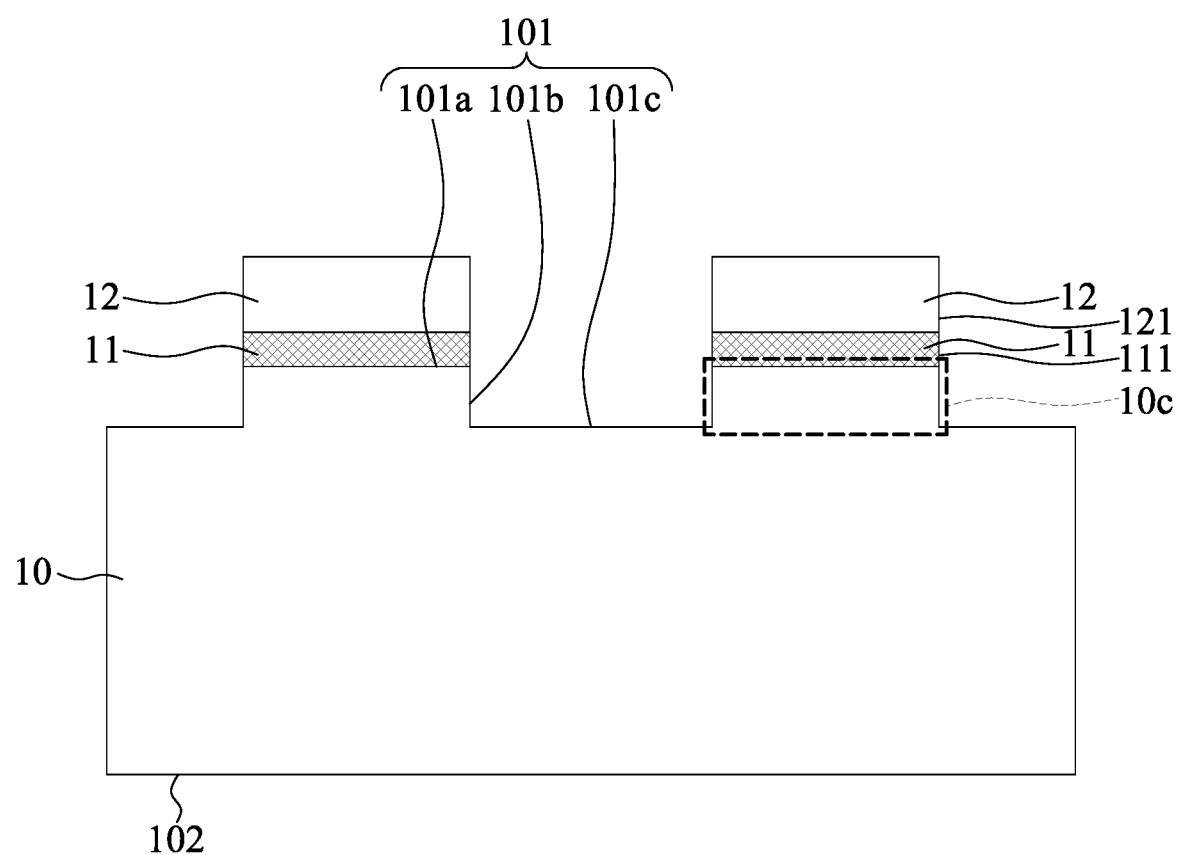
FIG. 2D illustrates one or more stages of a method of manufacturing a semiconductor device in accordance with some embodiments of the present disclosure.

Referring to FIG. 2D, the hard mask pattern 20 may be removed by, for example, an etching process.

Figure 2E:
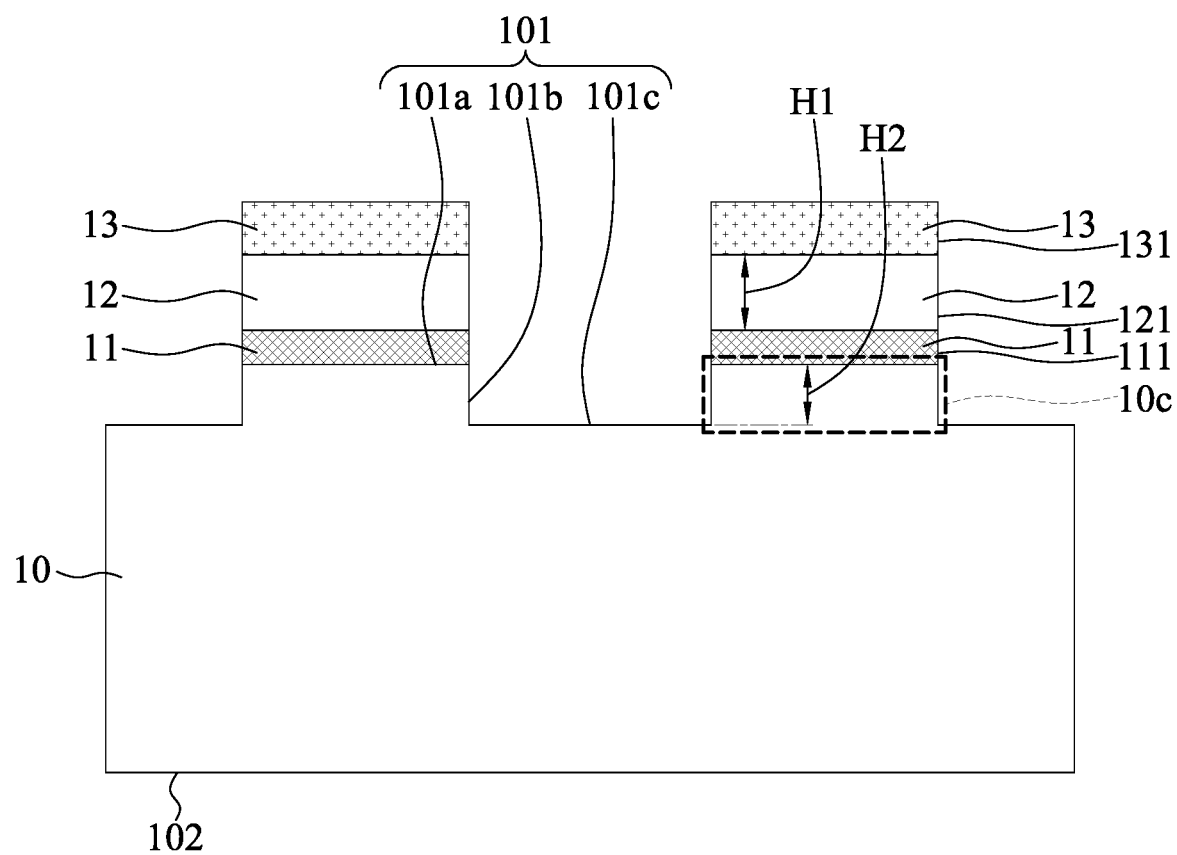
FIG. 2E illustrates one or more stages of a method of manufacturing a semiconductor device in accordance with some embodiments of the present disclosure.

Referring to FIG. 2E, the capping layer 13 may be deposited on the gate conductive layer 12. In some other embodiments, the capping layer 13 may be formed by ALD, PVD, CVD, a silicide process, other feasible operations, or a combination thereof. In some other embodiments, the capping layer 13 may be partially removed by for example, an etching process.

In some embodiments, the surface (or a lateral surface) 131 of the capping layer 13 may be substantially coplanar with the portion 101b of the surface 101 of the substrate 10, the surface 111 of the dielectric layer 11, and/or the surface 121 of the gate conductive layer 12.

Figure 2F:
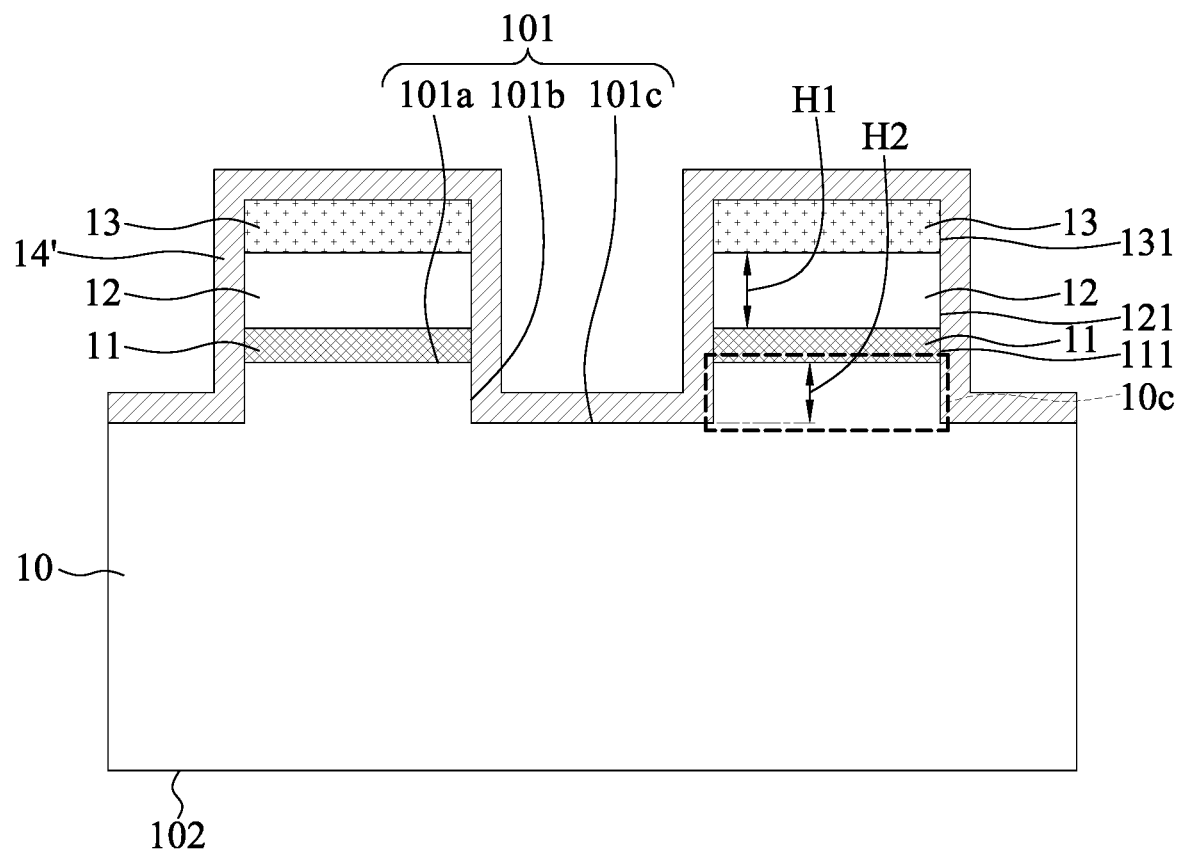
FIG. 2F illustrates one or more stages of a method of manufacturing a semiconductor device in accordance with some embodiments of the present disclosure.

Referring to FIG. 2F, a dielectric layer 14' may be disposed on the gate structure (including the dielectric layer 11, the gate conductive layer 12, and the capping layer 13) on the substrate 10. In some embodiments, the dielectric layer 14' may be formed through, for example, CVD, LPCVD, PECVD, other feasible operations, or a combination thereof. In some embodiments, the dielectric layer 14' may cover the portion 101b and the portion 101c of the surface 101 of the substrate 10. In some embodiments, the dielectric layer 14' may cover the surface 111 of the dielectric layer 11, the surface 121 of the gate conductive layer 12, and the surface 131 of the capping layer 13.

Figure 2G:
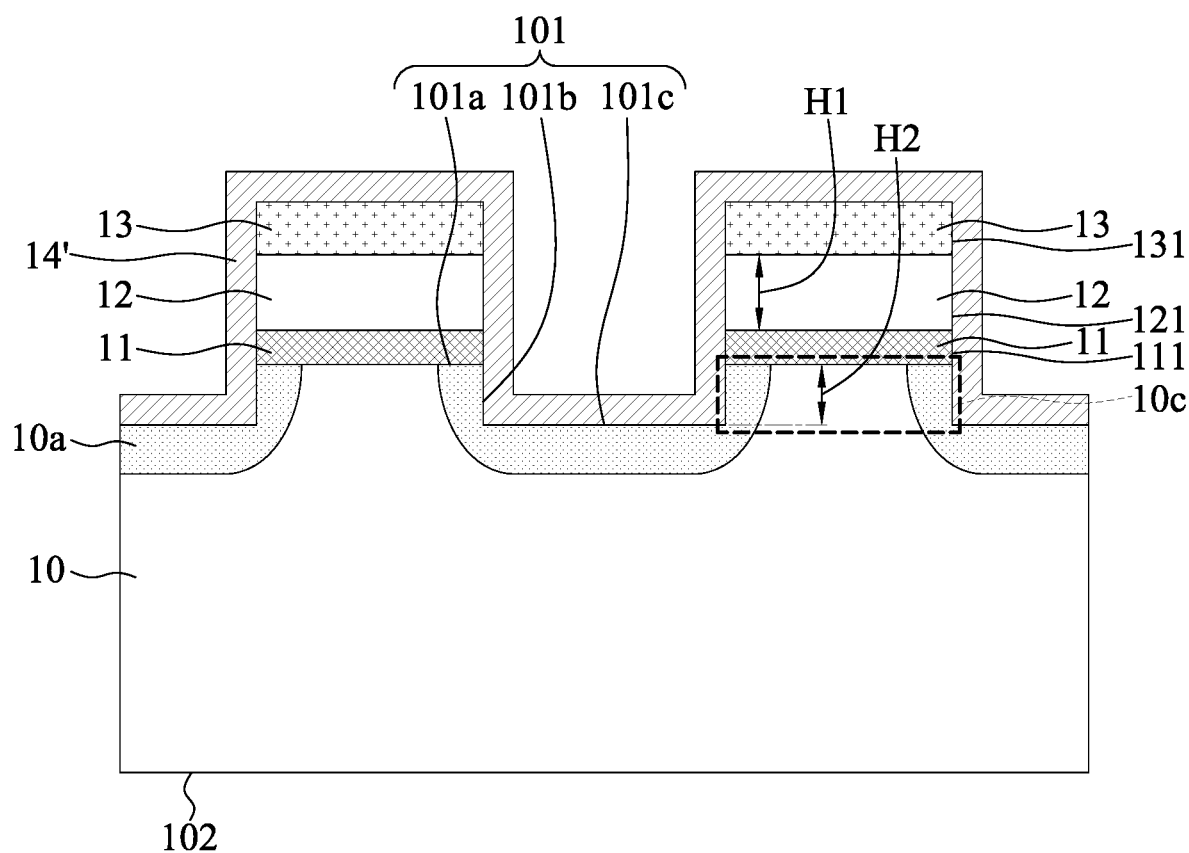
FIG. 2G illustrates one or more stages of a method of manufacturing a semiconductor device in accordance with some embodiments of the present disclosure.

Referring to FIG. 2G, the doped region 10a may be formed in the substrate 10. In some embodiments, the doped region 10a may be formed by, for example, an ion implantation operation, such as plasma-immersion ion implantation, solid state diffusion, etc. In some embodiments, an annealing process may be performed to remove the implantation-induced damage and/or lattice defects. In some embodiments, the dielectric layer 14' may impede the penetration of the dopants into the substrate 10. Therefore, the doped region 10a may have a doping concentration lower than a doping concentration of the doped region 10b subsequently formed.

In some other embodiments, prior to the formation of the dielectric layer 14', a blanket light ion implantation operation may be conducted to form the doped region 10a.

Figure 2H:
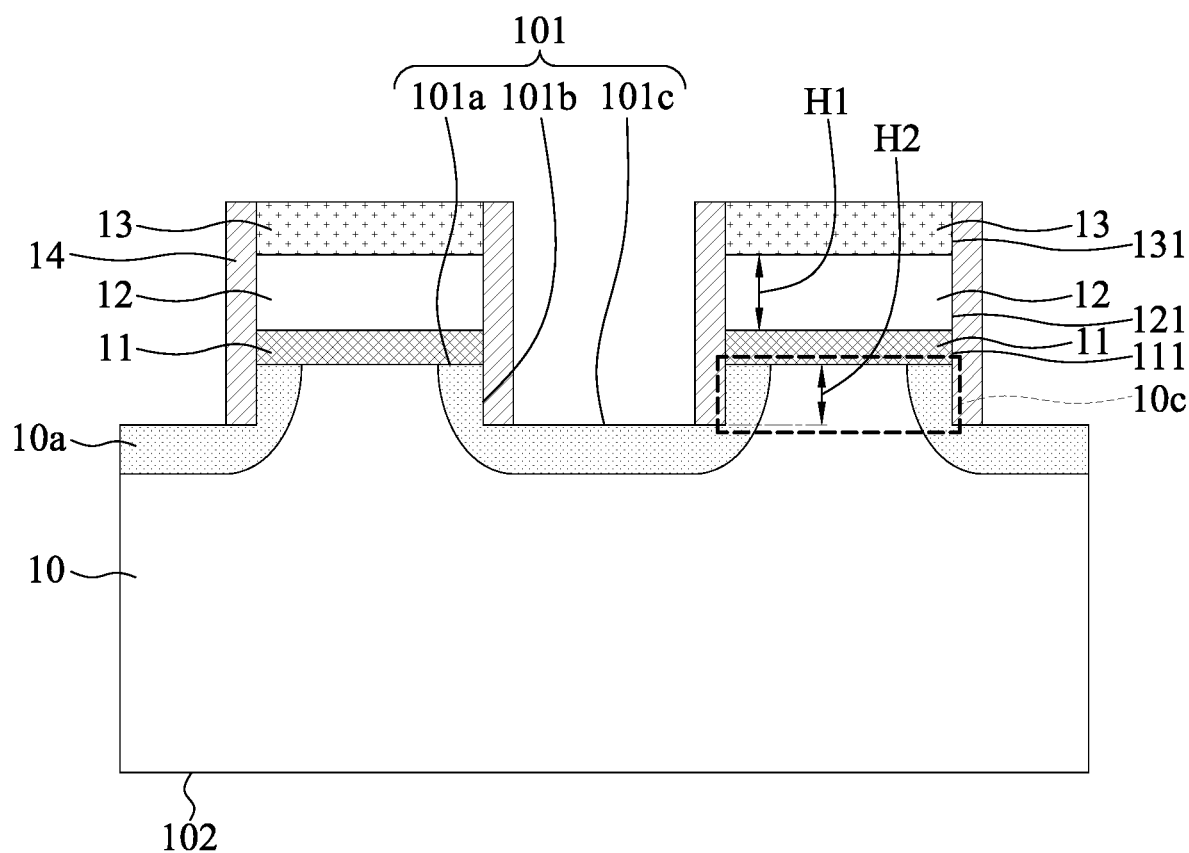
FIG. 2H illustrates one or more stages of a method of manufacturing a semiconductor device in accordance with some embodiments of the present disclosure.

Referring to FIG. 2H, the dielectric layer 14' may be anisotropically etched to form the spacer 14. After the etching operation, the capping layer 13 and the portion 101c of the surface 101 of the substrate 10 may be exposed.

Figure 2I:
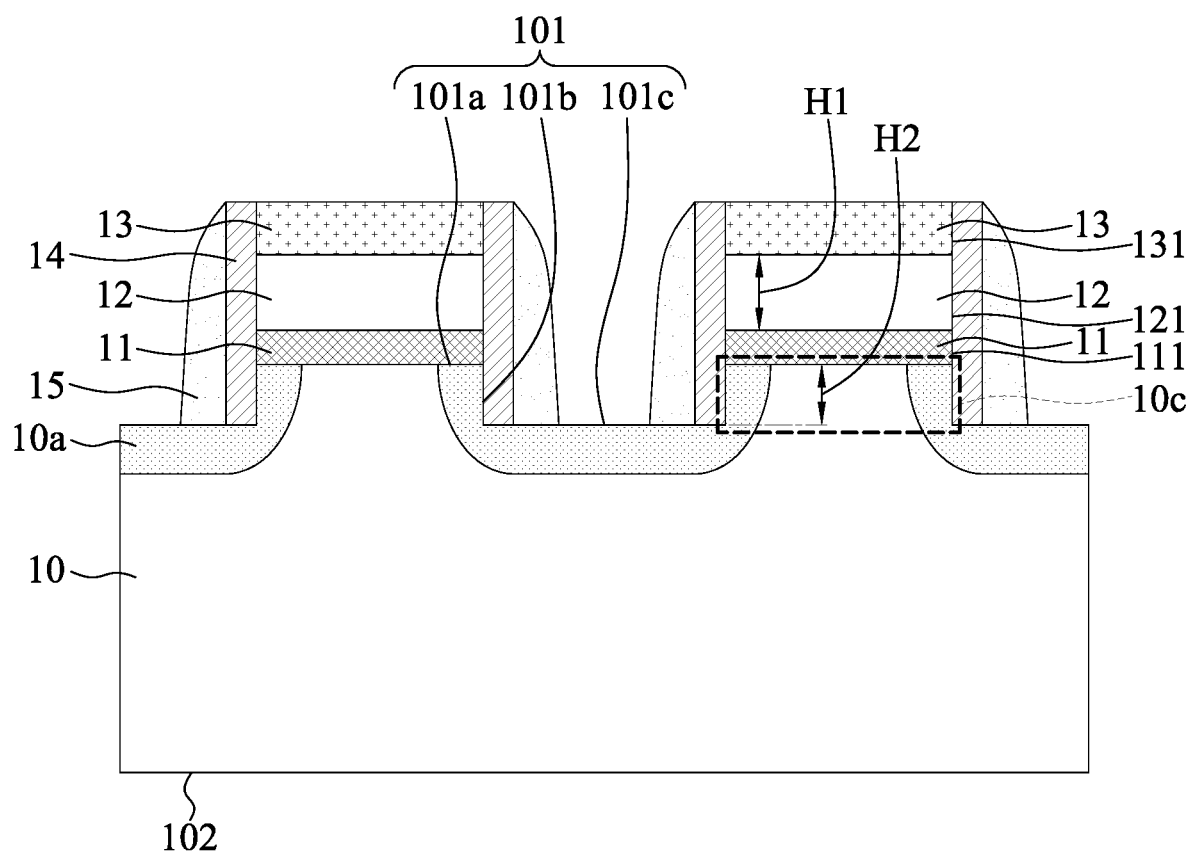
FIG. 2I illustrates one or more stages of a method of manufacturing a semiconductor device in accordance with some embodiments of the present disclosure.

Referring to FIG. 2I, the spacer 15 may be disposed on the portion 101c of the surface 101 of the substrate 10. In some embodiments, the spacer 15 may be formed through, for example, CVD, LPCVD, PECVD, other feasible operations, or a combination thereof. Then, an etching operation (such as RIE) may be conducted to remove a part of the spacer 15 and expose a part of the portion 101c of the surface 101 of the substrate 10.

Figure 2J:
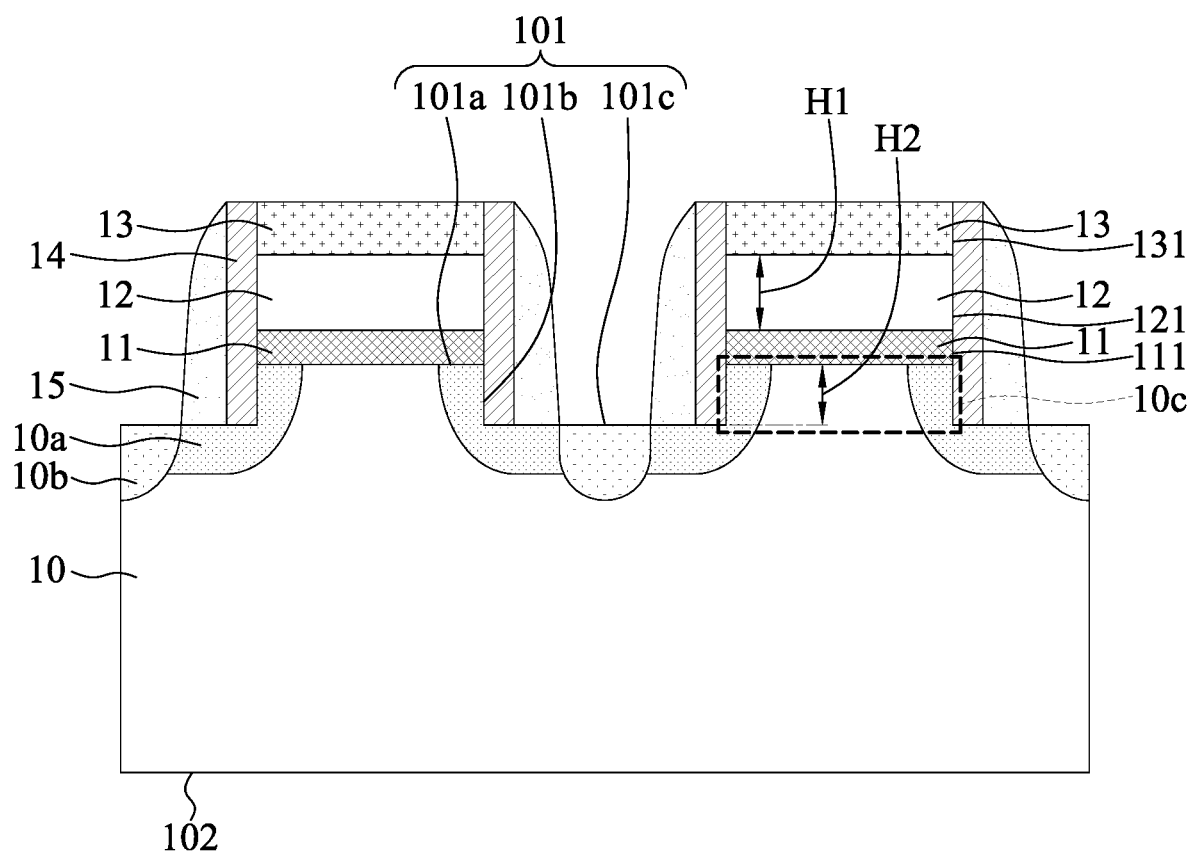
FIG. 2J illustrates one or more stages of a method of manufacturing a semiconductor device in accordance with some embodiments of the present disclosure.

Referring to FIG. 2J, the doped region 10b may be formed in the substrate 10. In some embodiments, the doped region 10b may be formed by, for example, an ion implantation operation, such as plasma-immersion ion implantation, solid state diffusion, etc. In some embodiments, the doped region 10b may be formed by using the spacer 15 as an ion implantation mask.

In some embodiments, the doped region 10b may be formed by implanting into the substrate 10 N-type (for an NMOS device) or P-type dopants (for a PMOS device) at a doping level significantly higher than the ion implant dose used to form the doped region 10a. In the areas where the doped region 10b overlaps the doped region 10a, the heavier doping level of the doped region 10b may overcome the lighter doping level of the doped region 10a. Therefore, a source region and/or a drain region may be formed in the overlapped areas.

Figure 3:
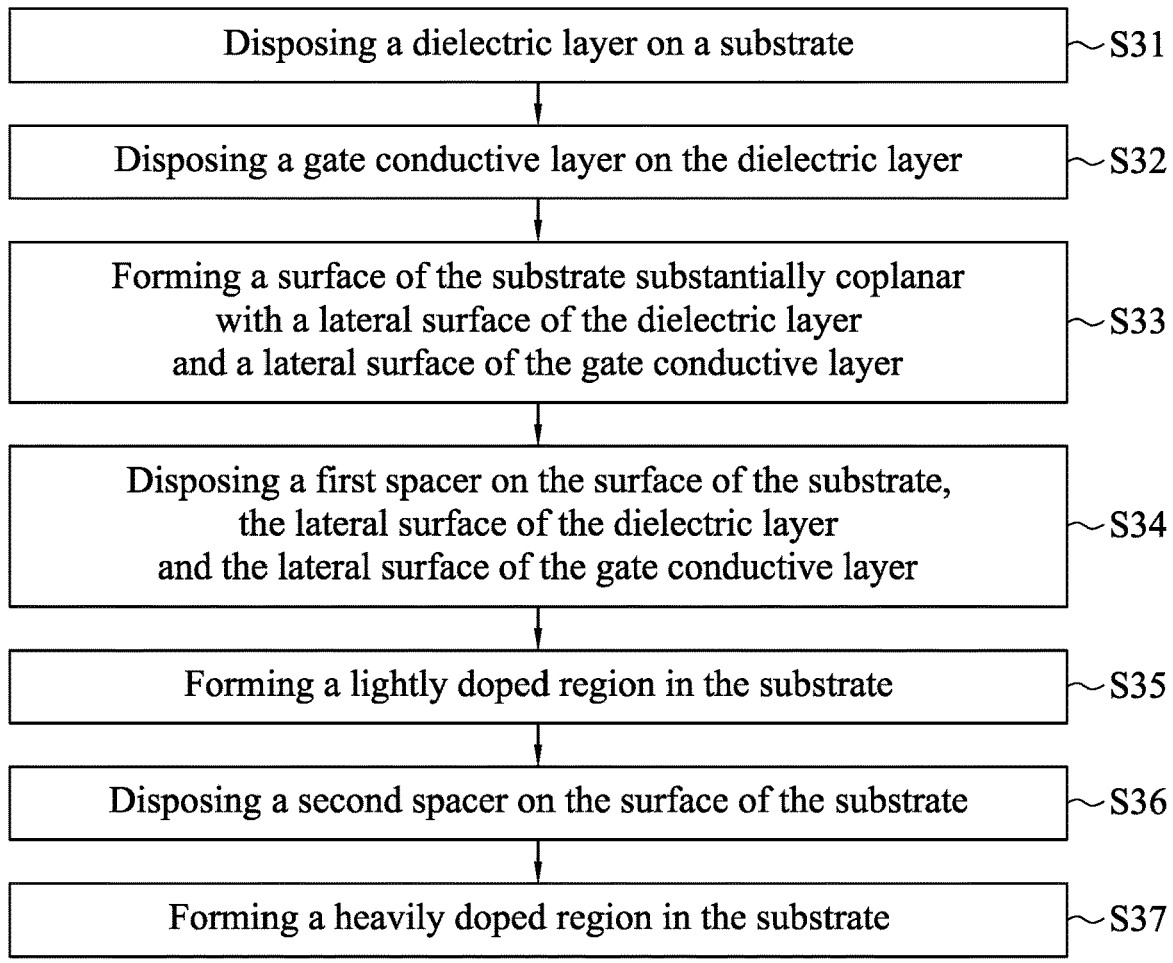
FIG. 3 illustrates a flow chart of a method of manufacturing a semiconductor device in accordance with some embodiments of the present disclosure.

FIG. 3 illustrates a flow chart of a method 30 of manufacturing a semiconductor device in accordance with some embodiments of the present disclosure.

In some embodiments, the method 30 may include a step S31, disposing a dielectric layer on a substrate. For example, as shown in FIG. 2A, the dielectric layer 11' may be disposed on the surface 101 of substrate 10.

In some embodiments, the method 30 may include a step S32, disposing a gate conductive layer on the dielectric layer. For example, as shown in FIG. 2A, the gate conductive layer 12' may be disposed on the dielectric layer 11'.

In some embodiments, the method 30 may include a step S33, forming a surface of the substrate substantially coplanar with a lateral surface of the dielectric layer and a lateral surface of the gate conductive layer. For example, as shown in FIG. 2C, the portion 101b of the surface 101 of the substrate 10 may be substantially coplanar with the surface 111 of the dielectric layer 11 and/or the surface 121 of the gate conductive layer 12.

In some embodiments, the method 30 may include a step S34, disposing a first spacer on the surface of the substrate, the lateral surface of the dielectric layer and the lateral surface of the gate conductive layer. For example, as shown in FIG. 2H, the spacer 14 may be disposed on the surface 111 of the dielectric layer 11, the surface 121 of the gate conductive layer 12, and the surface 131 of the capping layer 13.

In some embodiments, the method 30 may include a step S35, forming a lightly doped region in the substrate. For example, as shown in FIG. 2G, the doped region 10a may be formed in the substrate 10.

In some embodiments, the method 30 may include a step S36, disposing a second spacer on the surface of the substrate. For example, as shown in FIG. 2I, the spacer 15 may be disposed on the portion 101c of the surface 101 of the substrate 10.

In some embodiments, the method 30 may include a step S37, forming a heavily doped region in the substrate. For example, as shown in FIG. 2J, the doped region 10b may be formed in the substrate 10.

One aspect of the present disclosure provides a semiconductor device. The semiconductor device includes a substrate having a surface. The surface has a first portion and a second portion protruding from the first portion. The semiconductor device also includes a dielectric layer disposed on the second portion and a gate conductive layer disposed on the dielectric layer.

Another aspect of the present disclosure provides a semiconductor device. The semiconductor device includes a substrate having a first surface and a second surface protruding from the first surface of the substrate. The semiconductor device also includes a gate oxide layer disposed on the second surface of the substrate and a first spacer disposed on the first surface of the substrate. The first spacer contacts the substrate and the gate oxide layer.

Another aspect of the present disclosure provides a method of manufacturing a semiconductor device. The method includes disposing a dielectric layer on a substrate, disposing a gate conductive layer on the dielectric layer, and forming a surface of the substrate substantially coplanar with a lateral surface of the dielectric layer and a lateral surface of the gate conductive layer.

By forming a gate structure (including a gate conductive layer and a dielectric layer) on an elevated portion of a substrate, the gate conductive layer is elevated, and the height of the gate conductive layer may be reduced while the total height of the gate structure remains substantially unchanged. Compared with a conventional structure (i.e., the gate conductive layer is not elevated and the height of the gate conductive layer is greater), the reduced height of the gate conductive layer can prevent or decrease the unwanted parasitic capacitance. In addition, since the substrate has an elevated portion and the gate conductive layer is elevated, the effective channel length is increased and short-channel effect can be mitigated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate having a first surface and a second surface protruding from the first surface of the substrate;
a gate oxide layer disposed on the second surface of the substrate;
a first spacer disposed on the first surface of the substrate, and contacting the substrate and the gate oxide layer;
a second spacer contacting the first spacer; and
a lightly doped region partially exposed from the first surface of the substrate and contacting the first spacer and the second spacer.

2. The semiconductor device of claim 1, wherein the gate oxide layer is spaced apart from the first surface of the substrate.

3. The semiconductor device of claim 1, wherein the first surface of the substrate and the second surface of the substrate are substantially parallel.

4. The semiconductor device of claim 1, wherein a lateral surface of the gate oxide layer is substantially coplanar with a third surface of the substrate extending between the first surface of the substrate and the second surface of the substrate.

5. The semiconductor device of claim 1, further comprising:
a gate conductive layer disposed on the gate oxide layer, wherein the first spacer further contacts the gate conductive layer.

6. The semiconductor device of claim 1, further comprising:
a capping layer disposed on the gate conductive layer, wherein the first spacer extends between the capping layer and the first surface of the substrate.

7. The semiconductor device of claim 1, wherein the second spacer is disposed on the first surface of the substrate.

8. The semiconductor device of claim 1, wherein the first spacer is disposed between the gate oxide layer and the second spacer.

9. The semiconductor device of claim 1, wherein the lightly doped region is partially exposed from the second surface of the substrate.

10. The semiconductor device of claim 1, further comprising:
a heavily doped region disposed in the lightly doped region and partially exposed from the first surface of the substrate.

11. A method of manufacturing a semiconductor device, comprising:
providing a substrate having a first surface and a second surface protruding from the first surface of the substrate;
forming a gate oxide layer on the second surface of the substrate;
forming a first spacer on the first surface of the substrate, and contacting the substrate and the gate oxide layer;
forming a second spacer contacting the first spacer; and
forming a lightly doped region partially exposed from the first surface of the substrate and contacting the first spacer and the second spacer.

12. The method of claim 11, further comprising:
forming a gate conductive layer on the gate oxide layer, wherein the first spacer further contacts the gate conductive layer.

13. The method of claim 11, further comprising:
forming a capping layer on the gate conductive layer, wherein the first spacer extends between the capping layer and the first surface of the substrate.

14. The method of claim 11, wherein the second spacer is on the first surface of the substrate.

15. The method of claim 11, wherein the first spacer is between the gate oxide layer and the second spacer.

16. The method of claim 11, further comprising:
forming a heavily doped region in the lightly doped region and partially exposed from the first surface of the substrate.

* * * * *